United States Patent [19]

Nakamura

[11] Patent Number: 5,305,222

[45] Date of Patent: Apr. 19, 1994

[54] PATTERN FORMING SYSTEM

[75] Inventor: Hatsuo Nakamura, Yokohama, Japan

[73] Assignee: Kabushiki Kaisha Toshiba, Kawasaki, Japan

[21] Appl. No.: 807,205

[22] Filed: Dec. 16, 1991

[30] Foreign Application Priority Data

Dec. 19, 1990 [JP] Japan ............................ 2-403792

[51] Int. Cl.$^5$ ............................................. G03B 27/32
[52] U.S. Cl. ................................ 364/468; 355/53; 355/77
[58] Field of Search ................. 364/468, 486–491; 355/40, 43, 45, 46, 53, 54, 77; 356/356, 363, 401

[56] References Cited

U.S. PATENT DOCUMENTS 4,488,806 12/1984 Takahashi et al. ..................... 355/77
4,530,587 7/1985 Kosuqi et al. .
4,734,746 3/1988 Ushida et al. ......................... 355/53

OTHER PUBLICATIONS

European Search Report dated Sep. 11, 1992.

*Primary Examiner*—Jerry Smith
*Assistant Examiner*—Thomas E. Brown
*Attorney, Agent, or Firm*—Finnegan, Henderson, Farabow, Garrett & Dunner

[57] ABSTRACT

There is provided a pattern forming system of the present invention comprising a reticule on which a pattern is formed on one or more chips, an apparatus for preliminarily arranging a plurality of shot regions of a main surface of a wafer in a matrix manner in a case where regions where the pattern is formed by one shot are used as shot regions, an apparatus for calculating the number of the shot regions, which constitutes the matrix after sequentially moving the position of the shot regions to be a center of the matrix in a state that wafer is fixed, and the number of the chips wherein the pattern is completely formed on the main surface of the wafer, an apparatus for selecting a case in which the number of the shot regions constituting the matrix is the smallest and the number of the chips in which the pattern is completely formed on the main surface of the wafer is the largest, and an apparatus for forming the pattern, which is formed on the reticule, on each shot region constituting the matrix.

5 Claims, 7 Drawing Sheets

PATTERN FORMING SYSTEM

BACKGROUND OF THE INVENTION

1. Field of the Invention

The present invention relates to a pattern forming system wherein a pattern formed on a reticule is demagnified and projected on a surface of a wafer by a step-and repeat photolithographic system with demagnification (hereinafter called stepper) and an application of such a system to an apparatus for exposing photoresist formed on the wafer in a step and repeat system.

2. Description of the Related Art

Conventionally, in a case where a pattern formed on a reticule is demagnified and projected on the surface of a wafer, and the pattern is formed on the surface of the wafer, the pattern formed on the reticule is formed on the surface of the wafer by one shot. Generally, a plurality of shots can be carried out to one wafer, and a plurality of the same patterns are formed on the surface of the wafer in a matrix manner. As a method for forming the plurality of the same patterns on the entire surface of the wafer by the plurality of shots, the following four cases can be considered as shown in Table 1.

TABLE 1

|  | Array Method | | | |
| --- | --- | --- | --- | --- |
| X Direction | Even Number | Even Number | Odd Number | Odd Number |
| Y Direction | Even Number | Odd Number | Even Number | Odd Number |
|  | FIG. 7 | FIG. 8 | FIG. 9 | FIG. 10 |

The above four cases can be considered based on the assumption of a two-dimensional coordinate on the surface of the wafer. As shown in FIG. 1, the first case relates to shot regions (1 to 38), and shows that an even number of shot regions in which the patterns formed on the reticule exist in the respective X and Y directions from an origin of the coordinate axes. As shown in FIG. 2, the second case relates to shot regions 1 to 40 and shows that an even number of shot regions exist in the X direction and that an odd number of shot regions exist in the Y direction. As shown in FIG. 3, the third case relates to shot regions 1 to 39, and shows that an odd number of shot regions exist in the X direction and that an even number of shot regions exist in the Y direction. As shown in FIG. 4, the fourth case relates to shot regions (1 to 37), and shows that an odd number of shot regions exist in the respective X and Y directions.

In the mentioned cases, assuming that, for example, a diameter of the wafer is 5 inches and a size of one shot region is 15 mm×15 mm, the number of complete patterns to be formed in the wafer will be 38 according to the first case of FIG. 1, 40 according to the second case of FIG. 2, 39 according to the third case of FIG. 3, and 37 according to the fourth case of FIG. 4. Therefore, if the patterns to be formed by one shot constitutes one integrated circuit (IC), the maximum number of ICs to be obtained from one wafer can be obtained in the array method of the shot regions shown in FIG. 2. In other words, if the patterns on the reticule are formed on the surface of the wafer by use of the array method of the shot regions shown in FIG. 2, the maximum number of ICs can be obtained from one wafer, and efficiency of IC production can be improved.

In a case where the patterns formed on the reticule are actually formed on the surface of the wafer, it is necessary to chose the case in which the maximum number of ICs can be obtained from one wafer. In this case, conventionally, workers must actually count the number of ICs to be obtained from one wafer in each case in order to select the case in which the maximum number of ICs can be obtained.

However, if the size of each IC is made small, and the number of ICs to be obtained from one wafer is increased, counting the number of ICs is extremely hard work for the workers.

FIG. 5 shows the relationship between the size of the chip and the gross of the chip gross relating to an experimental value and a theoretical value. A theoretical value shown by a broken line of FIG. 5 is a number, which is obtained by dividing an area of a main surface of the wafer by an area of one IC. A chip gross shown by a solid line of FIG. 5 is a number of ICs, which are actually formed on the main surface of the wafer in a complete shape if the patterns are formed on the surface of the wafer by a predetermined array method. In other words, if the size of the IC is 3 mm×3 mm, both the experimental value of the chip gross and the theoretical value are about 1300, respectively. Due to this, it is impossible for workers to count the number of ICs formed on the surface of the wafer one by one.

SUMMARY OF THE INVENTION

An object of the invention is to provide a pattern forming system wherein a pattern formed on a reticule, is demagnified and projected on a surface of a wafer according to an array method in which the number of times of shots is minimized and an array method of shot regions where the number of ICs to be formed on the surface of the wafer is automatically selected in demagnifying and projecting the pattern thereon.

In order to attain the above object, the pattern forming system of the present invention comprises a reticule on which a pattern is formed of one or more chips, an apparatus for preliminarily arranging a plurality of shot regions on a main surface of a wafer in a matrix manner in a case where regions where the pattern is formed by one shot are used as shot regions, an apparatus for calculating the number of the shot regions, which constitutes the matrix after sequentially moving the position of the shot regions to be a center of the matrix in a state that wafer is fixed, and the number of the chips wherein the pattern is completely formed on the main surface of the wafer, an apparatus for selecting a case in which the number of the shot regions constituting the matrix is the smallest and the number of the chips in which the pattern is completely formed on the main surface of the wafer is the largest, and an apparatus for forming the pattern, which is formed on the reticule, on each shot region constituting the matrix.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

The pattern forming system relating to the embodiment of the present invention will be explained with reference to the drawings.

In the above description of the related art, it was explained that the four cases can be considered to expose photoresist formed on the wafer in the step and repeat system. According to the present invention, in a case where the plurality of the same patterns are formed on the surface of the wafer in a matrix manner, the array method of the regions (shot regions) where on pattern is formed is not limited to the above-mentioned four cases. In other words, the present invention provides an apparatus for automatically determining an array method of shot regions wherein the number of times of demagnifying and projecting the pattern on the surface of the wafer becomes minimum and the number of the ICs to be formed on one wafer becomes maximum.

With reference to FIGS. 6 to 9, there will be explained the method for forming the maximum number of ICs on the surface of one wafer, the method for calculating the shot gross and the chip gross in the case of such a method in forming the plurality of the same patterns is formed on the surface of the wafer in a matrix manner.

First, a wafer size WS is selected from either one of 3, 4, 5, or 6 inches. A center of the wafer (shown by a mark x of FIGS. 6 to 8) is determined, and defined as an origin O. Then, an X axis and an Y axis being at a right angle to the X axis are determined based on the origin O, thereby a two-dimensional coordinate system is determined.

Next, a shot size S and a chip size CS will be explained. The shot size S means a size of one pattern (shot region) to be formed on the surface of the wafer by one shot. The chip size CS means a size of the region to be as one chip formed on the surface of the wafer. In other words, there is a case that a plurality of patterns are formed on the surface of the wafer by one shot, or there is a case that a pattern of one chip is formed on the surface of the wafer by one shot. In the latter case, the shot size S and the chip size CS are equal to each other. The following explanation will be based on the assumption that the shot size S and the chip size CS are equal to each other in order to make the explanation simple.

A basic shot region can be formed as follows.

Figure 1:
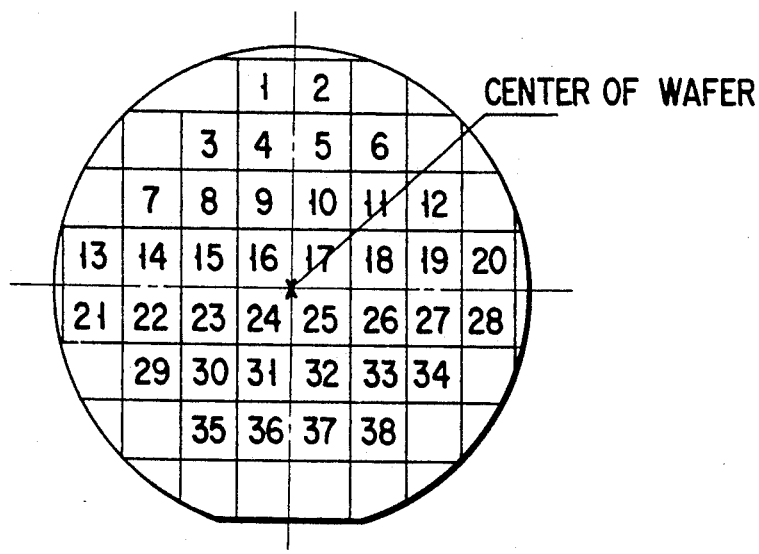
FIGS. 1 to 4 are plane views of a wafer showing one of the conventional array methods.
Figure 2:
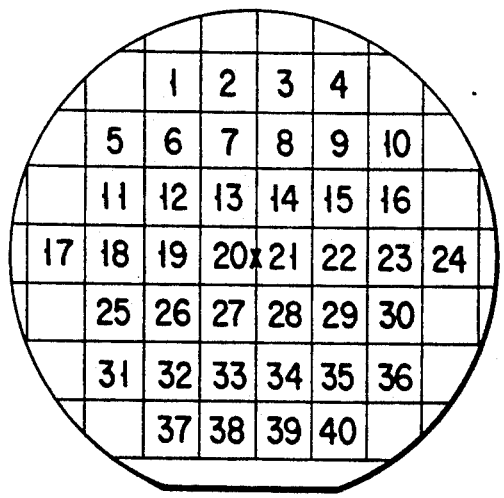
Figure 3:
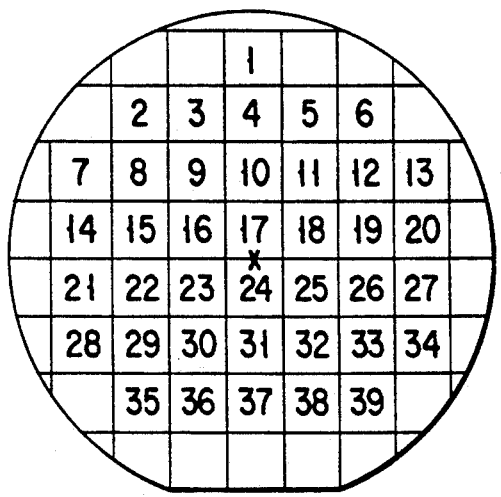
Figure 4:
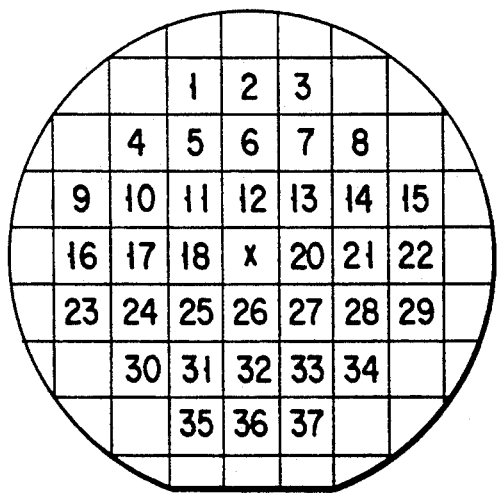
Figure 5:
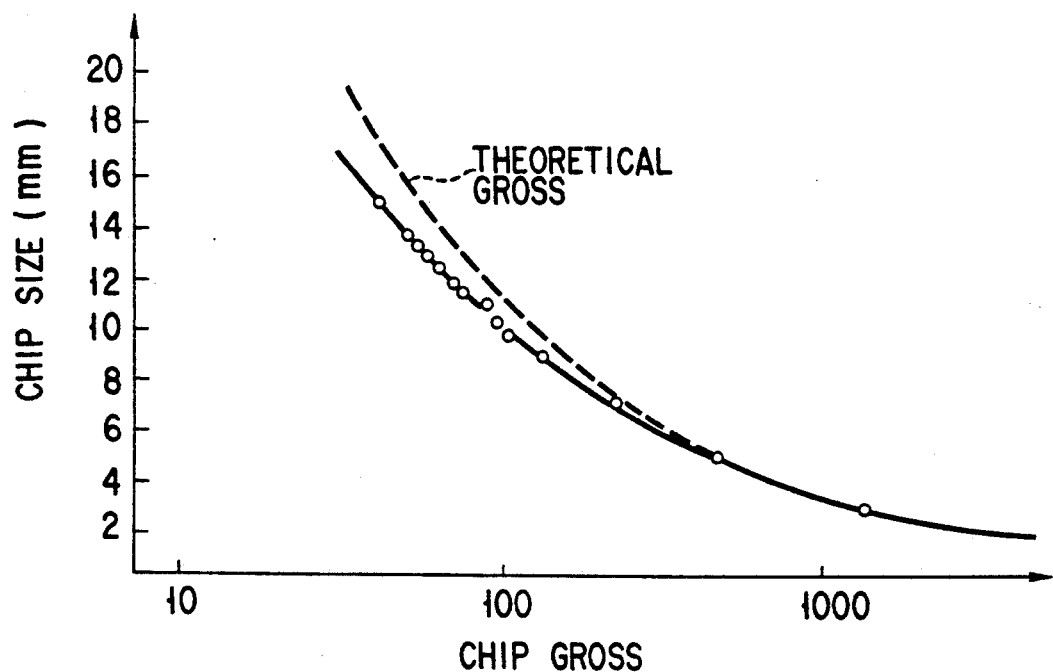
FIG. 5 is a view showing the relationship between a chip gross and a chip size.
Figure 6:
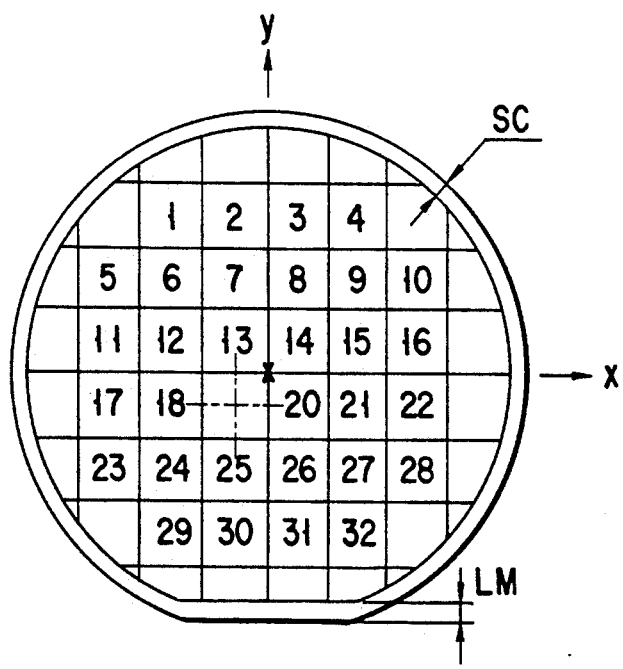
FIGS. 6 to 8 are plane views showing the wafer on which a pattern on a reticule is formed by the pattern forming system of the present invention.
Figure 7:
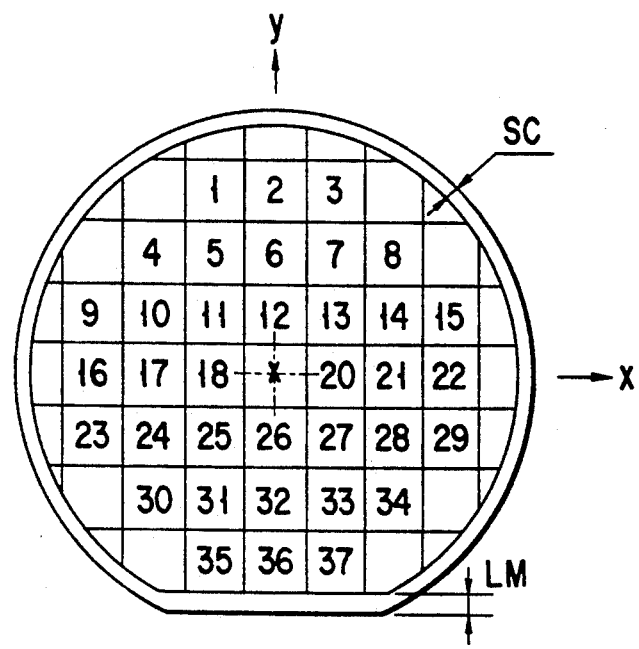
Figure 8:
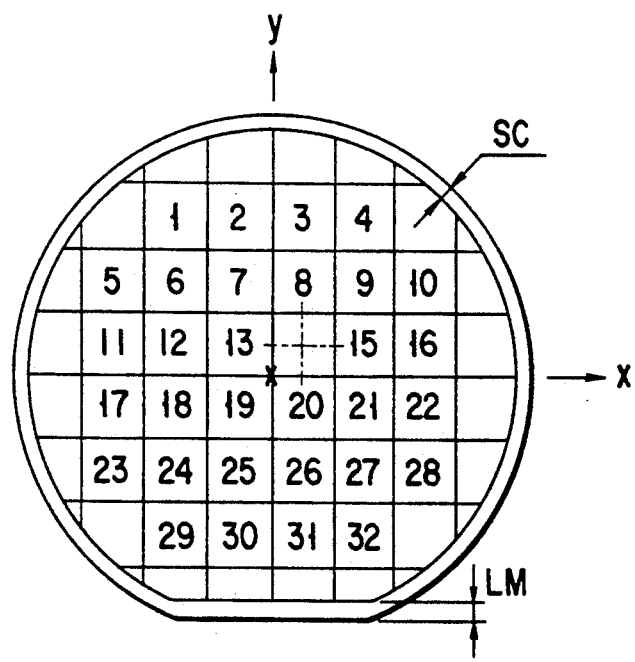

In the surface of the wafer, a plurality of the shot regions in which one pattern is formed are arranged in a matrix manner (regions 1 to 31 of FIGS. 6 to 8, regions 1 to 37 of FIG. 7). The basic shot region is one of the plurality of shot regions which is positioned close to the center of the wafer and serves as a center of the arrangement. Moreover, the central point of the basic shot region is defined as a central point of the arrangement.

The central point of the arrangement is sequentially moved in the vicinity of the origin O of the two-dimensional coordinate system. At this time, the position of the central point of the arrangement is separated from the origin O by a distance R (x, y) shown in the following equation (1):

$$R(x, y) = \sqrt{(x^2 + y^2)} \tag{1}$$

The central point of the arrangement can move in the range shown in the following inequalities (2) and (3):

$$-CS_x/2 \leq x \leq CS_x/2 \tag{2}$$

$$-CS_y/2 \leq y \leq CS_y/2 \tag{3}$$

In the range shown in the inequalities (2) and (3), the central point is sequentially moved from the points $(-CS_x/2, -CS_y/2)$ by 1/10 of the chip size CS. Then, the shot gross and the chip gross are calculated according to the array method of the shot region at each point.

The calculation method of the shot gross and the chip gross will be explained as allows:

For example, the distance from the origin O to four corners of each shot region is calculated. Then, the number of the shot regions in which all four corners of each shot region are in a radius of the wafer (WS/2) is counted. In other words, even if one of four corners is positioned out of the radius of the wafer, such a region is not counted.

Moreover, a defect area can be formed in the periphery of the wafer. In this case, a surround cut region SC may be formed in the periphery of the wafer. Furthermore, in the calculation of the shot gross and the chip gross, the wafer size WS' can be determined by the following equation (4):

$$WS' = WS - 2 \times SC \tag{4}$$

Moreover, it is possible to form a data area LM in an orientation flat portion of the wafer. In this case, the data area LM may be assumed as an outside portion of the wafer. In addition, various data on the wafer can be recorded in the data area LM.

Figure 9:
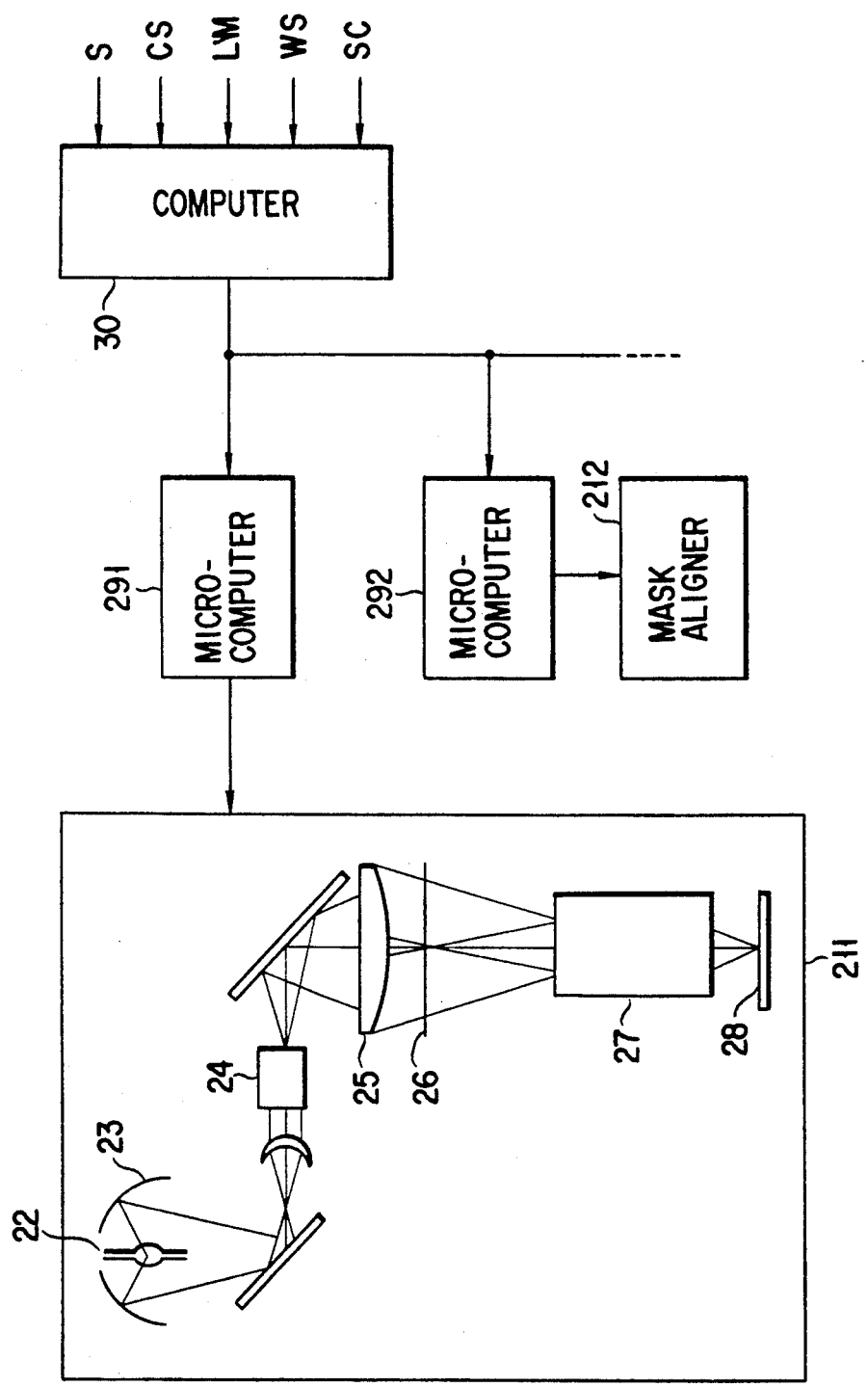
FIG. 9 is a block diagram showing the pattern forming system relating to the embodiment of the present invention.

FIG. 9 shows a basic structure of the pattern forming system relating to the embodiment of the present invention. In FIG. 9, reference numeral 211 is a mask aligner. The mask aligner 211 comprises a mercury lamp 22, an ellipitic mirror 23, an integrator 24, a condenser lens 25, a reticule 26, and a reduction lens (1/m magnification) 27. On a wafer 28, for example, a $SiO_2$ film is formed. In order to pattern the $SiO_2$ film, a photoresist film is formed on the $SiO_2$ film. Thereafter, light is applied to the reticule 26 by the mercury lamp 22. As a result, the pattern formed on the reticule 26 is demagnified and projected on the surface of the wafer 28, and the photoresist film is exposed.

Generally, the pattern forming system has a plurality of aligners. For example, in FIG. 9, the plurality of aligners 211, 212 are formed. Reference numerals 291, 292, . . . are microcomputers, which are formed in each mask aligners 211, 212 and controls the operation of the mask aligners. The microcomputers 291, 292 are controlled by a host computer 30.

In order to calculate the shot gross and the chip gross according to the the array method of the plurality of the shot regions, data on the shot size S, chip size CS, data area LM of the orientation flat portion, wafer size WS, surround cut SC are input to the host computer 30 as a parameter. The host computer 30 calculates the shot gross and the chip gross according to the array method of each shot region based on these data. Moreover, the host computer 30 selects an array method of the shot region in which the number of the ICs to be formed on one wafer becomes maximum from the plurality of the array methods. By use of the array method, the pattern on the reticule is formed on the surface of the wafer.

Figure 10:
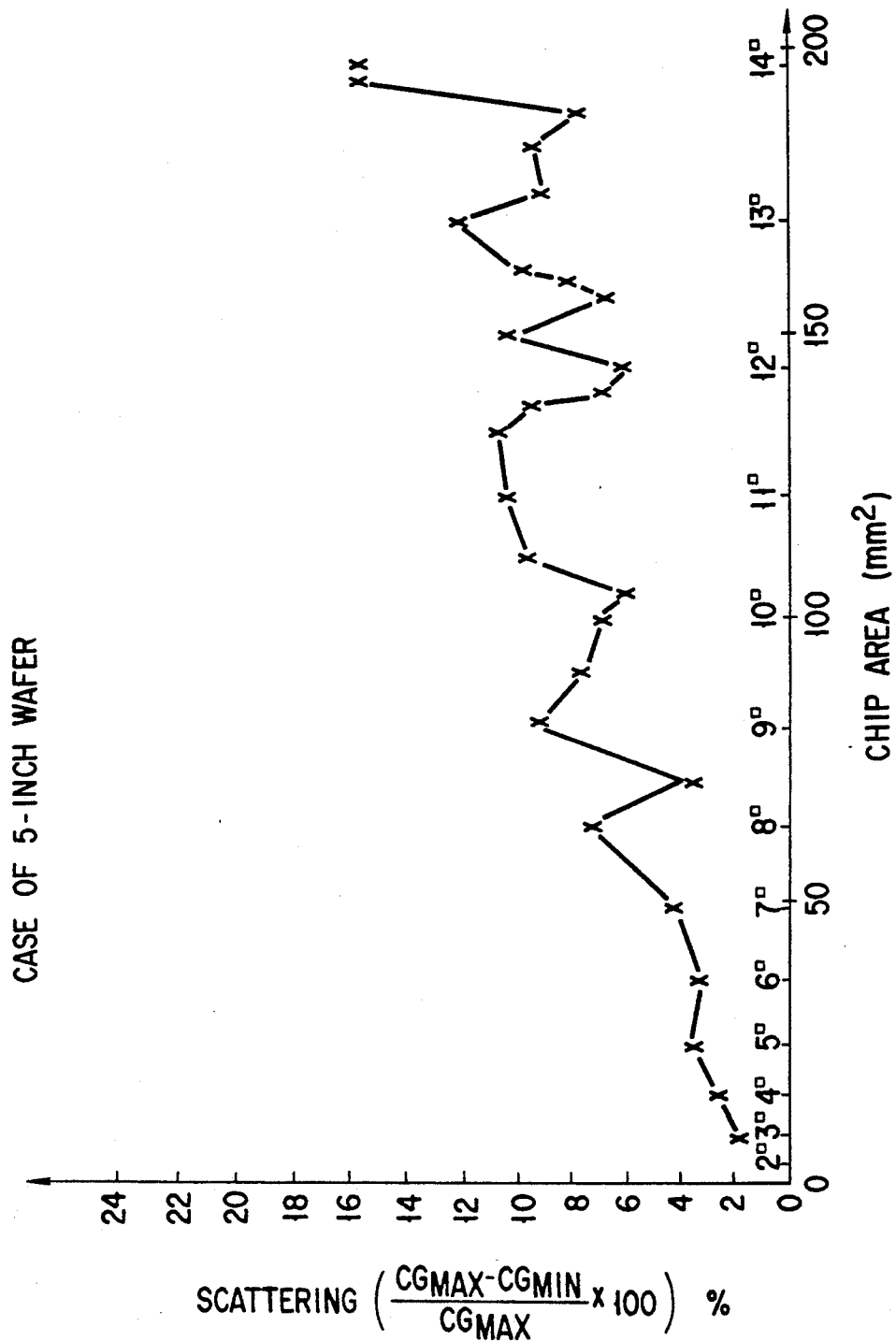
FIG. 10 is a view showing the relationship of the scattering between the chip size and the chip gross.

According to the above-mentioned embodiment, it is clarified that the chip gross CG is different depending on the array method of the shot regions. FIG. 10 is a view showing the relationship of the scattering between the array method of the shot regions and the chip gross. In FIG. 10, $CC_{MAX}$ and $CG_{MIN}$ are respectively a maximum value of the chip gross and a minimum value thereof when the chip area is parameter.

As is obvious from FIG. 10, the scattering of the chip gross increases as the chip size CS increases. That is, the number of ICs to be obtained in the complete form in the wafer is changed depending on the array method of the shot regions. According to the present invention, in a short period time, it is possible to automatically determine the array method of the shot regions in which the number of times of shots is the smallest and the number of the the chip gross is the largest. According to this array method, the pattern formed on the reticule can be demagnified and projected on the surface of the wafer.

Figure 11:
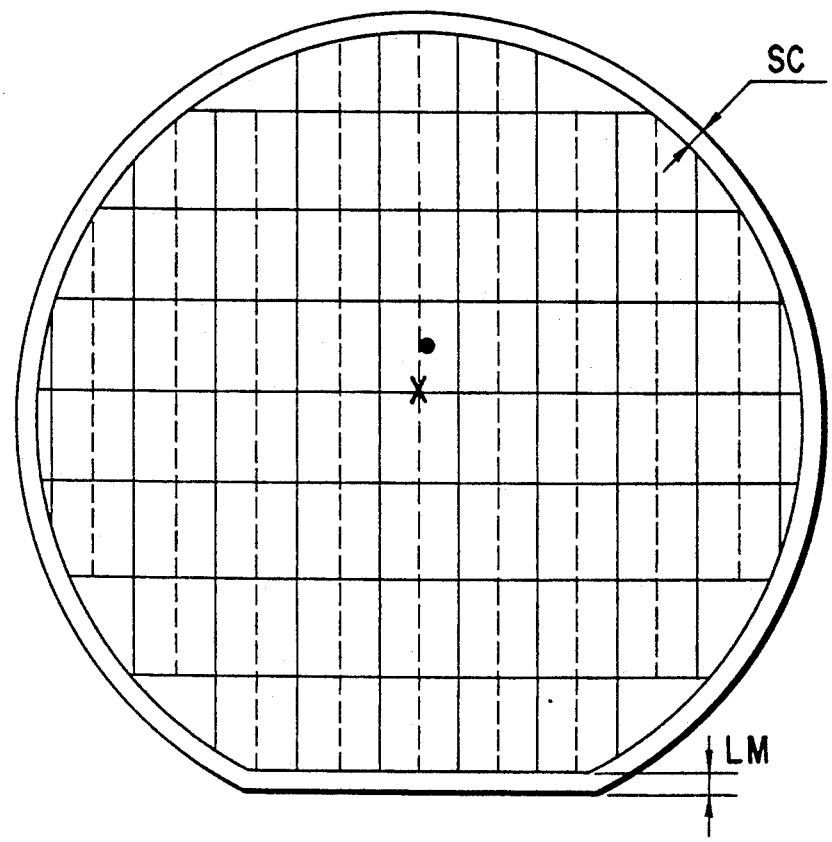
FIG. 11 is a plane view showing a wafer on which the pattern on the reticule is formed by the pattern forming system of the present invention.

FIG. 11 shows a wafer on which a chip of 4 megabytes of DRAM is formed. In this case, the number of chips, which is formed on the surface of the wafer by one shot, is two.

Therefore, according to the embodiment of the present invention, the shot size and the chip size are different. In FIG. 11, a portion enclosed with a solid line shows one shot line, and two chip patterns, which are divided by a broken line, are formed in one shot region. A mark X shows a center of the wafer, and a black circle mark shows a center of the shot array. Moreover, a space between the center of the wafer and the black circle mark is a map off-set. The size of the map off-set of FIG. 11 is 0. 654 mm in the X direction and 12 mm in the Y direction.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A pattern forming system comprising:

a reticule on which a pattern is formed of one or more chips;

arranging means for preliminarily arranging a plurality of shot regions on a main surface of a wafer in a matrix arrangement where each shot region is formed by one shot of the pattern formed on the reticule, the matrix arrangement including a basic shot region positioned proximate the center of the matrix arrangement wherein the basic shot region has a central point;

calculating means for calculating the number of the shot regions which constitute said matrix arrangement by sequentially moving the matrix arrangement on the main surface of the wafer to move the central point of the basic shot region in a two-dimensional coordinate system comprised of an X axis and an Y axis having an origin defined at a center of the wafer, wherein each sequential movement of the matrix arrangement moves the central point of the basic shot region in a range of $-S_x/2 \leq x \leq S_x/2,$ and $-S_y/2 \leq y \leq S_y/2,$ where $S_x$ is a size of each shot region in a direction along the X axis, and $S_y$ is a size of each shot region in a direction along the Y axis, said calculating means further calculating the number of the chips to be completely formed on said main surface of said wafer by each sequential movement of the matrix arrangement;

selecting means for selecting a case in which the number of shot regions constituting said matrix arrangement is smallest and the number of chips to be completely formed on said main surface of said wafer is largest; and forming means for forming said pattern, which is formed on said reticule, on the main surface of the wafer for each shot region of the matrix arrangement.

2. The system according to claim 1, wherein a defect region is formed in a periphery of said wafer, and shot regions are arranged in regions other than said defect region.

3. The system according to claim 1, wherein a data area is formed in the periphery of said wafer and shot regions are arranged in regions other than said data area.

4. The system according to claim 1, wherein the pattern formed on the reticule is of a chip, and further wherein the chip formed on the main surface of the wafer has a size equal to the size $S_x$ of the shot region in the X direction and a size equal to the size $S_y$ of the shot region in the Y direction.

5. The system according to claim 1, wherein the central point of the basic shot region is sequentially moved by a distance of 1/10 of the chip size in the X direction and by a distance of 1/10 of the chip size in the Y direction.

* * * * *

UNITED STATES PATENT AND TRADEMARK OFFICE
CERTIFICATE OF CORRECTION

PATENT NO. : 5,305,222
DATED : April 19, 1994
INVENTOR(S) : Hatsuo Nakamura

It is certified that error appears in the above-indentified patent and that said Letters Patent is hereby corrected as shown below:

On the title page item [57], line 3, change "on" to --of--.

On the title page item [57], line 4, change "of" (second occurrence) to --on--.

Claim 1, column 6, line 17, change "an" (first occurrence) to --a--.

Signed and Sealed this

Thirty-first Day of January, 1995

Attest:

BRUCE LEHMAN

*Attesting Officer*      *Commissioner of Patents and Trademarks*